(12) United States Patent
Horio et al.

(10) Patent No.: US 7,745,345 B2
(45) Date of Patent: Jun. 29, 2010

(54) ZNO BASED SEMICONDUCTOR DEVICE MANUFACTURE METHOD

(75) Inventors: Naochika Horio, Yokohama (JP);
Kazufumi Tanaka, Machida (JP)

(73) Assignee: Stanley Electric Co., Ltd., Tokyo (JP)

( * ) Notice: Subject to any disclaimer, the term of this patent is extended or adjusted under 35 U.S.C. 154(b) by 51 days.

(21) Appl. No.: 12/265,105

(22) Filed: Nov. 5, 2008

(65) Prior Publication Data

US 2009/0124042 A1 May 14, 2009

(30) Foreign Application Priority Data

Nov. 9, 2007 (JP) .............................. 2007-291591

(51) Int. Cl.
*H01L 21/302* (2006.01)
*H01L 21/461* (2006.01)
*H01L 27/15* (2006.01)
*H01L 29/26* (2006.01)
*H01L 31/12* (2006.01)
*H01L 33/00* (2010.01)

(52) U.S. Cl. .................. 438/745; 438/689; 257/79; 257/103; 257/E33.019; 257/E33.074; 257/E21.476

(58) Field of Classification Search .............. 257/79, 257/103, E33.019, E33.074; 438/689, 745
See application file for complete search history.

(56) References Cited

U.S. PATENT DOCUMENTS

| 2003/0173568 | A1 | 9/2003 | Asakawa et al. |
| 2003/0218179 | A1 | 11/2003 | Koide et al. |
| 2006/0054888 | A1* | 3/2006 | Ito et al. ................. 257/43 |
| 2009/0045393 | A1* | 2/2009 | Nakahara .................. 257/13 |

FOREIGN PATENT DOCUMENTS

| JP | 2003-258296 A | 9/2003 |
| JP | 2003-318443 A | 11/2003 |

* cited by examiner

*Primary Examiner*—Ha Tran T Nguyen
*Assistant Examiner*—Aaron A Dehne
(74) *Attorney, Agent, or Firm*—Frishauf, Holtz, Goodman & Chick, P.C.

(57) ABSTRACT

A manufacture method for a ZnO based semiconductor device includes the steps of: (a) preparing a ZnO based semiconductor wafer including a ZnO based semiconductor substrate having a wurzeit structure with a +C plane on one surface and a −C plane on an opposite surface, a first ZnO based semiconductor layer having a first conductivity type epitaxially grown above the +C plane of the ZnO based semiconductor substrate, and a second ZnO based semiconductor layer having a second conductivity type opposite to the first conductivity type epitaxially grown above the first semiconductor layer; and (b) wet-etching the ZnO based semiconductor wafer with acid etching liquid to etch the −C plane of the ZnO based semiconductor substrate

7 Claims, 13 Drawing Sheets

FIG. 8

DEVICE PROPERTIES

| SAMPLE TYPE | EMISSION WAVELENGTH (nm) | TOTAL FLUX % |
|---|---|---|
| LIGHT EMITTING DEVICE OF COMPARATIVE EXAMPLE | 450 | 100 |
| FIRST EMBODIMENT | 450 | 120 |
| SECOND EMBODIMENT | 450 | 140 |

ZnO SUBSTRATE PLATE POLARITY
AND ETCHING CHARACTERISTICS

| TIME (MIN) | ETCHING AMOUNT ($\mu$m) | |
| --- | --- | --- |
| | +C PLANE | -C PLANE |
| 3 | 0 | 0.46 |
| 9 | 0 | 1.54 |
| 27 | 0 | 4.40 |

ETCHING CHARACTERISTICS OF ZnO SUBSTRATE

US 7,745,345 B2

ZNO BASED SEMICONDUCTOR DEVICE MANUFACTURE METHOD

CROSS REFERENCE TO RELATED APPLICATION

This application is based on and claims priority of Japanese Patent Application No. 2007-291591 filed on Nov. 9, 2007, the entire contents of which are incorporated herein by reference

BACKGROUND OF THE INVENTION

A) Field of the Invention

The present invention relates to a manufacture method for a ZnO based semiconductor device.

B) Description of the Related Art

Zinc oxide (ZnO) is expected, for example, as high efficiency light emitting material, and light emitting devices using ZnO based compound semiconductor have been proposed.

In order to improve a light pickup efficiency of a semiconductor light emitting device, it is generally known a method of performing irregularity (concavity/convexity) portions forming on the device surface. For example, JP-A-2003-318443 and JP-A-2003-258296 disclose techniques of improving a light pickup efficiency of a nitride semiconductor light emitting device through irregularity processing.

SUMMARY OF THE INVENTION

An object of the present invention is to provide novel processing techniques for ZnO based semiconductor material.

Another object of the present invention is to provide a manufacture method for a ZnO based semiconductor device applicable to manufacture of a ZnO based semiconductor light emitting device with an improved light pickup efficiency According to a first aspect of the present invention, there is provided a manufacture method for a ZnO based semiconductor device comprising steps of: (a) preparing a ZnO based semiconductor wafer including a ZnO based semiconductor substrate having a wurzeit structure with a +C plane on one surface and a −C plane on an opposite surface, a first ZnO based semiconductor layer having a first conductivity type epitaxially grown above the +C plane of the ZnO based semiconductor substrate, and a second ZnO based semiconductor layer having a second conductivity type opposite to the first conductivity type epitaxially grown above the first semiconductor layer; and (b) wet-etching the ZnO based semiconductor wafer with acid etching liquid to etch the −C plane of the ZnO based semiconductor substrate.

According to a second aspect of the present invention, there is provided a manufacture method for a ZnO based semiconductor device, wherein in the first aspect of the invention, the step (b) forms concavity/convexity portions on the −C plane of the ZnO based semiconductor substrate which is electrically conductive, and further including steps of: (c) forming a first electrode on the −C plane formed with the concavity/convexity portions by the step (b); and (d) forming a second electrode above the second semiconductor layer.

The −C plane of the ZnO based semiconductor substrate can be etched selectively relative to the +C plane through wet etching with acid etching liquid.

Even if an epitaxially grown structure is formed above the +C plane of the ZnO based semiconductor substrate, etching of this structure can be controlled. By utilizing this etching technique, for example, for selective formation of concavity/convexity portions on the −C plane, a light pickup efficiency of a ZnO based semiconductor light emitting device can be improved

BRIEF DESCRIPTION OF THE DRAWINGS

FIG. 8 is a table showing a list of properties of light emitting devices of the first and second embodiments and a comparative example.

DESCRIPTION OF THE PREFERRED EMBODIMENTS

Figure 9A:
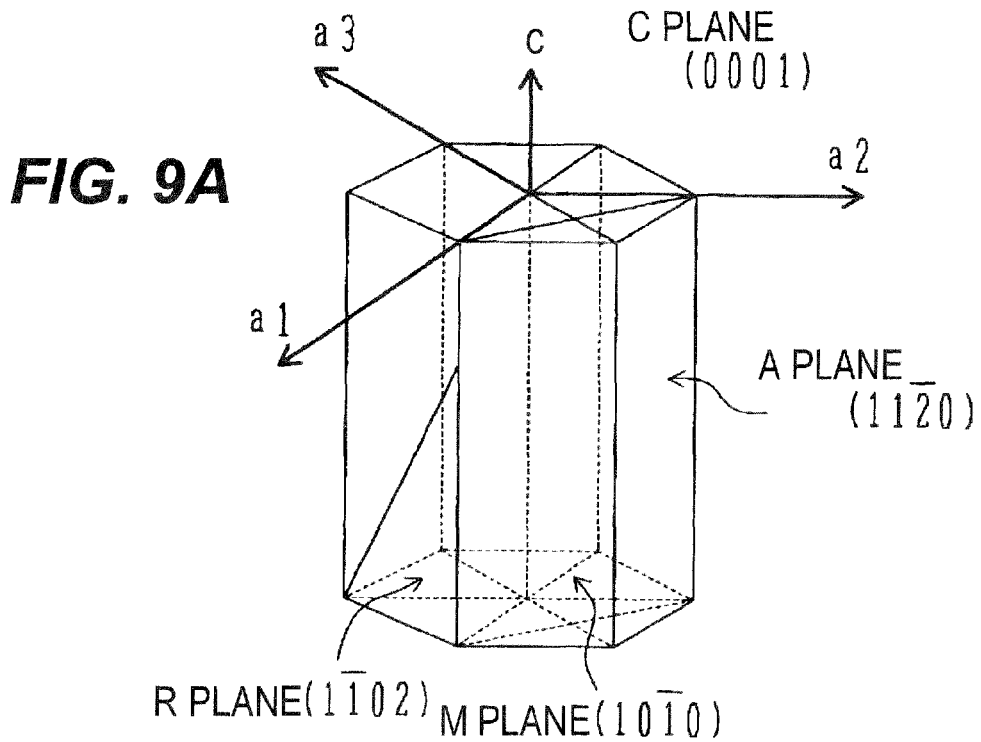
FIG. 9A is a schematic perspective view showing crystal orientation of a wurzeite structure.

Description will be made first on zinc oxide (ZnO) crystal of a wurzeit structure. FIG. 9A shows crystal orientation of the wurzeit structure. Crystal planes exist including a C plane, an A plane, an M plane and the like. The C plane is perpendicular to the C axis.

Figure 9B:
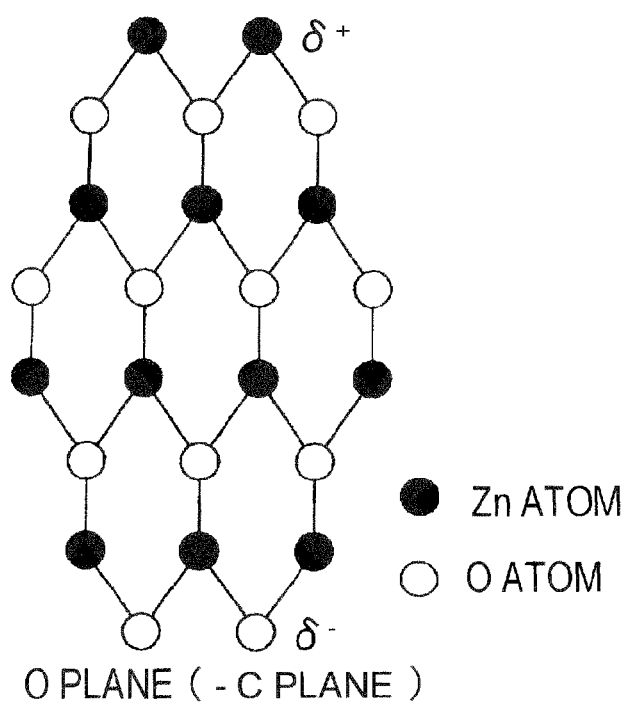
FIG. 9B is a schematic diagram showing the arrangement of atoms of ZnO crystal of the wurzeite structure along the C axis.

FIG. 9B shows an arrangement of atoms of ZnO crystal of the wurzeite structure along the C axis. Black circles indicate Zn atoms, and white circles indicate 0 atoms. An 0 atom plane (O plane) disposing O atoms and a Zn atom plane (Zn plane) disposing Zn atoms are alternately laminated, and the C plane of ZnO crystal of the wurzeit structure is classified into a +C plane as the Zn plane and a −C plane as the O plane. The +C plane is on one side along the C axis and the −C plane is on the other side.

Figure 9C:
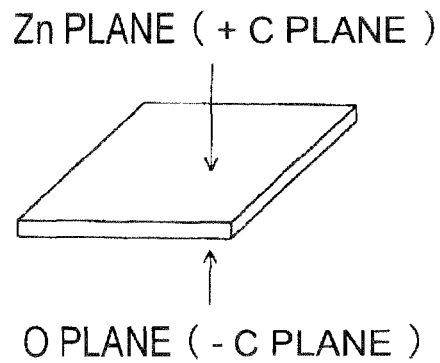
FIG. 9C is a schematic perspective view of a C plane ZnO substrate.

FIG. 9C is a schematic perspective view of a C plane ZnO substrate. The C plane ZnO substrate is a ZnO substrate exposing a +C plane on one surface and a −C plane on the bottom surface Next, description will be made on experiments for checking etching characteristics of a C plane ZnO substrate. A C plane ZnO substrate was etched with 10% nitric acid aqueous solution at a liquid temperature of 25° C., while stirring the etching liquid.

Figures 10A, 10B:
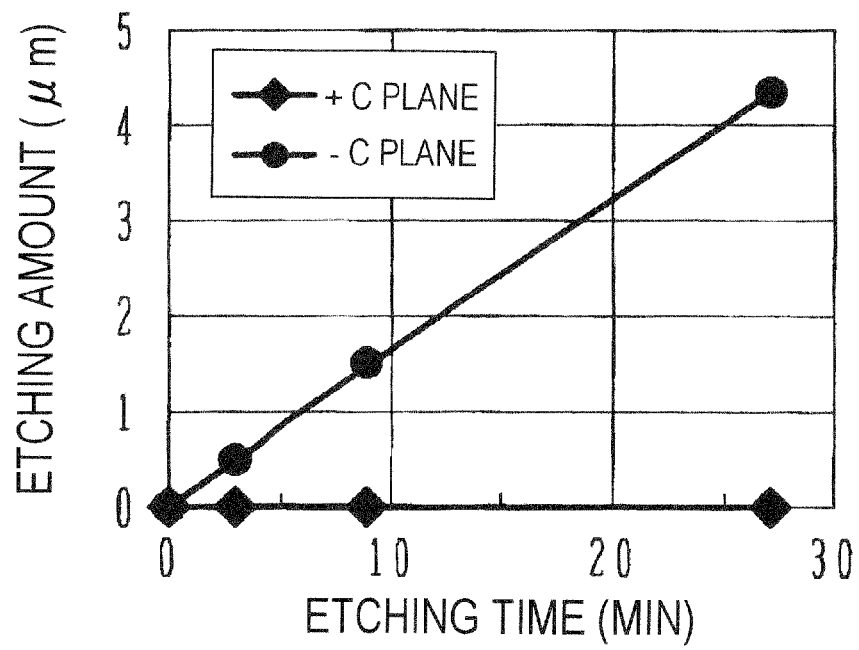
FIGS. 10A and 10B are a table and a graph showing dependency of etching amount upon an etching time of a C plane ZnO substrate.

FIGS. 10A and 10B are a table and a graph showing an etching amount dependency upon an etching time. Etching amounts of the −C plane were 0.46 μm, 1.54 μm and 4.40 μm for etching times of 3, 9 and 27 minutes, respectively, whereas etching amounts of the +C plane were 0 μm for all the etching times. The +C plane was hardly etched. An etching rate of the −C plane is about 0.16 μm/min. It has been found that the −C plane of ZnO crystal of the wurzeit structure is etched selectively relative to the +C plane by wet etching with acid etching liquid.

As shown in FIG. 9B, it is considered that the −C plane as the O atom plane is polarized by $\delta^-$ and the +C play as the ZnO atom plane is polarized by $\delta^+$. It is therefore considered that the −C plane is likely to be etched with acid etchant and the +C plane is hard to be etched.

It can be considered that as the acid etching liquid, sulfuric acid aqueous solution, hydrochloric acid aqueous solution, phosphoric acid aqueous solution, acetic acid aqueous solution or the like may also be used in addition to nitric acid aqueous solution. Acidic property is required for pH, and an etching rate can be controlled by adjusting pH. If a fast etching rate is desired, pH is preferably about pH 1 to pH 4, whereas if a slow etching rate is desired, pH is preferably about pH 4 to pH 6.

If mixed acid aqueous solution of the above-described acids or acid buffer aqueous solution is used as etching solution, flatness (irregularity) of an etched plane can be controlled in some cases. An etching solution density is effective in a wide range from several % to several ten %, and the density is selected based on the object such as an etching rate, an etching plane roughness.

Although experiment results for ZnO have been described, it is expected that the −C plane of ZnO based semiconductor of the wurzeit structure (e.g., compound semiconductor containing Mg, Be, Cd, S or Se introduced into ZnO in the range ensuring the wurzeit structure) can also be etched selectively relative to the +C plane with acid etchant.

Figure 11:
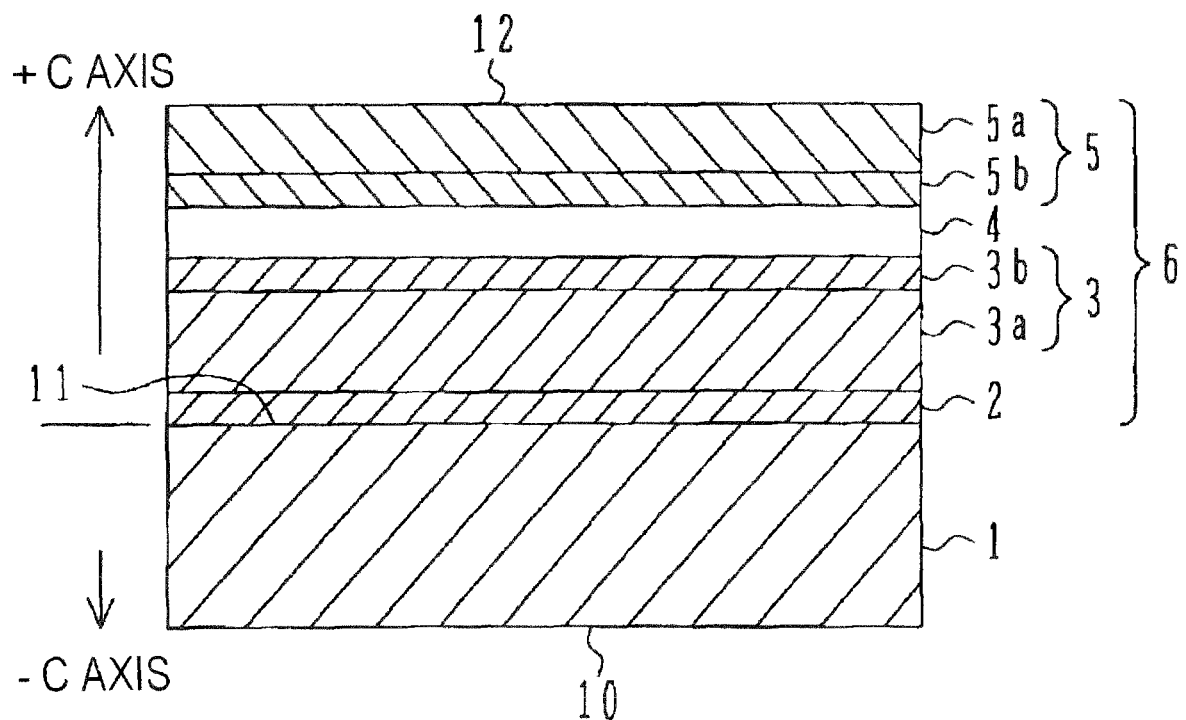
FIG. 11 is a schematic cross sectional view of a ZnO based semiconductor wafer with an operation layer.

Next, description will be made on an example of the structure of a ZnO based semiconductor wafer with an operation layer (hereinafter simply called a ZnO based semiconductor wafer where appropriate) to be used for a ZnO based semiconductor light emitting device of the embodiment. It is to be noted however that the etching method of the present invention is applicable to other devices not limiting only to the semiconductor light emitting device, FIG. 11 is a schematic cross sectional view of a ZnO based semiconductor wafer. A C plane ZnO substrate 1 has a −C plane at its one surface (lower surface in the figure) 10 and a +C plane at its opposite surface (upper surface in the figure) 11. A buffer layer 2 of ZnO is formed on the +C plane 11. An n-type ZnO based semiconductor layer 3 is formed on the buffer layer 2, a ZnO based semiconductor emission layer 4 is formed on the n-type ZnO based semiconductor layer 3, and a p-type ZnO based semiconductor layer 5 is formed on the emission layer 4.

The buffer layer 2 to p-type ZnO based semiconductor layer 5 are epitaxially grown on and above the +C plane 11 of the C plane ZnO substrate 1, to have the +C plane on the upper surface.

The upper surface 12 of the p-type ZnO based semiconductor layer 5 as the upper most surface is the +C plane. The buffer layer 2 to p-type ZnO based semiconductor layer 5 are formed, for example, by metal organic vapor phase epitaxy (MOVPE), molecular beam epitaxy (MBE), metal organic molecular beam epitaxy (MOM BE), vapor phase epitaxy (VPE) or the like.

As conductivity type determining impurities, gallium (Ga) is doped in the n-type ZnO based semiconductor layer 3, and nitrogen (N) is doped in the p-type ZnO based semiconductor layer 5. The lamination structure of the layers 3, 4 and 5 constitutes an emission structure of p layer, emission layer and n layer. The lamination structure of the layers 3, 4 and 5 is called a semiconductor operation layer (or light emitting diode (LED) operation layer) 6 (or simply called hereinafter an operation layer where appropriate).

The n-type ZnO based semiconductor layer 3, emission layer 4 and p-type ZnO based semiconductor layer 5 may take any well-known structure. For example, the n-type ZnO based semiconductor layer 3 has a structure that an n-type ZnO based semiconductor layer 3b as a clad layer is formed on an n-type ZnO based semiconductor layer 3a as a contact layer, and the p-type semiconductor layer 5 has a structure that a p-type ZnO based semiconductor layer 5a as a contact layer is formed on a p-type ZnO based semiconductor layer 5b as a clad layer. The n- and p-type clad layers 3b and 5b are formed for confining carriers in the emission layer 4, and are made of, e.g., MgZnO.

The emission layer 4 may be, for example, a single layer of ZnO based semiconductor, or may be a multi quantum well (MQW) structure having a well layer and a barrier layer of a thin film alternately laminated. Combinations of a well layer/a barrier layer may be ZnO/MgZnO, ZnO/BeZnO, ZnOSe/ZnO, ZnOS/ZnO, CdZnO/ZnO, ZnOSe/MgZnO, ZnOS/MgZnO, CdZnO/MgZnO, ZnOSe/BeZnO, ZnOS/BeZnO, CdZnO/BeZnO.

Functional layers necessary for manufacturing a ZnO based semiconductor light emitting device at a minimum are two layers including the n-type ZnO based semiconductor layer and p-type ZnO based semiconductor layer. In a pn junction emission structure, the p- and n-type ZnO based semiconductor layers are laminated with a pn junction being interposed therebetween.

It is preferable from the viewpoint of an emission efficiency and the like that the light emitting device has a structure inserting an emission layer between the p- and n-type semiconductor layers (structure that the p-type semiconductor layer and emission layer are laminated via a junction and the emission layer and n-type semiconductor layer are laminated via the junction) rather than a pn type emission structure. In this description, a light emitting device having an emission structure of p layer, emission layer and n layer as the operation layer is used by way of example.

The buffer layer 2 may be omitted, and the n-type ZnO based semiconductor layer 3 may be epitaxially grown directly on the ZnO substrate 1.

In a ZnO based semiconductor wafer actually prepared, the C plane ZnO substrate 1 has a thickness of 200 μm and an n-type conductivity, the buffer layer 2 is a ZnO layer having a thickness of 30 nm, the n-type ZnO based semiconductor layer 3 is a Ga doped ZnO layer having a thickness of 200 nm, the emission layer 4 is a CdZnO layer having a thickness of 2 nm, and the p-type ZnO based semiconductor layer 5 is a lamination structure of an N doped MgZnO clad layer having a thickness of 70 nm and an N doped ZnO contact layer having a thickness of 100 nm. It was confirmed that the LED operation layer (lamination of the layers 3, 4 and 5) had the +C axis orientated toward the surface (upper surface) direction. An emission wavelength of this ZnO based semiconductor wafer is, for example, 450 nm.

Figure 1A:
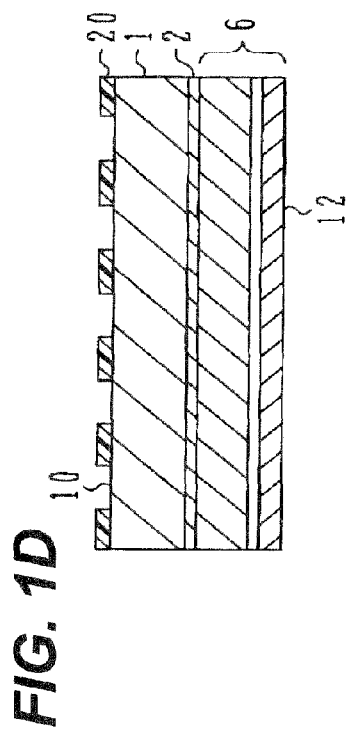
FIGS. 1A to 1F are schematic cross sectional views illustrating manufacture processes for a light emitting device according to a first embodiment of the present invention.
Figure 1B:
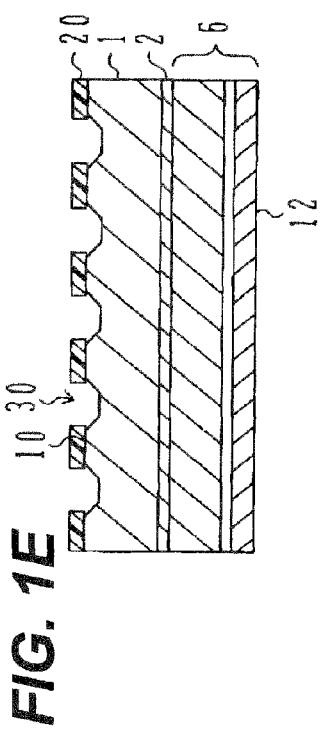

Next, description will be made on a ZnO based semiconductor light emitting device according to the first embodiment of the present invention. First, as shown in FIG. 1A, a ZnO based semiconductor wafer of the type described above is prepared Next, as shown in FIG. 1B, resist is coated by a spin coater on the whole surface of the −C plane of the ZnO substrate 1 opposite to the surface on which the LED operation layer 6 was formed, and thereafter prebaking is performed to form a resist film 20

Figure 1C:
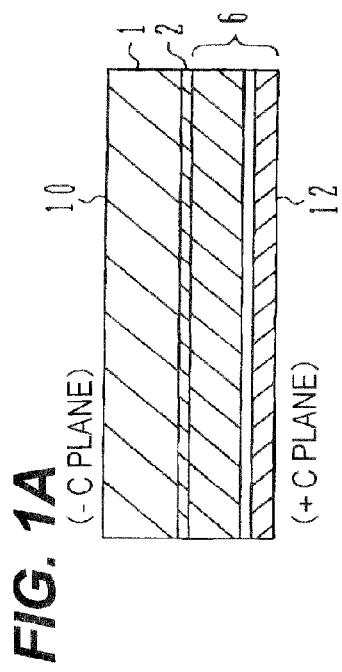

Next, as shown in FIG. 1C, a photomask having an opening pattern with a number of regular hexagonal openings is made in contact with the resist surface and exposed to transfer the opening pattern to the resist film 20.

Figure 1D:
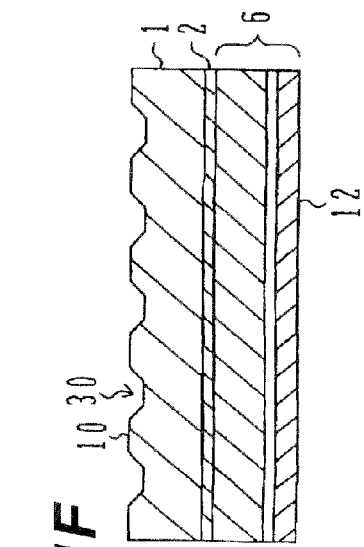

Next, as shown in FIG. 1D, the resist is developed to remove the exposed pattern portion and form a mask made of the resist film 20.

Figure 1E:
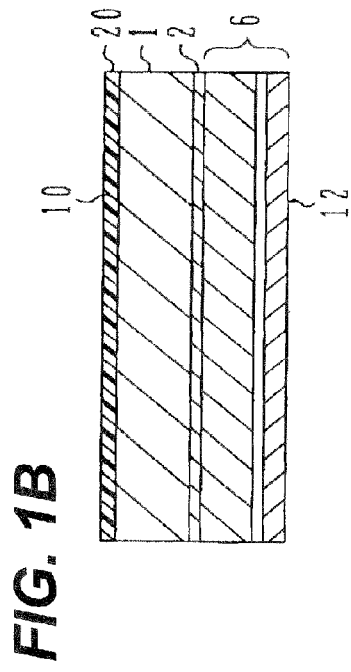

Next, as shown in FIG. 1E, by using the resist film 20 as a mask, the −C plane 10 of the ZnO substrate 1 is wet etched to form concavity portions 30 on the −C plane 10. As explained in the experiments, wet etching of the −C plane uses 10% nitric acid aqueous solution, for example. An etching time is set to 12 minutes at a room temperature to form the concavity portions 30 having a depth of about 2 μm. In this manner, the concavity/convexity portions are formed on the −C plane 10.

Figure 1F:
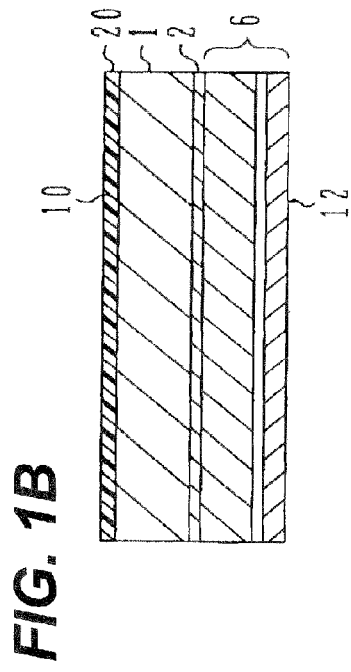

Next, as shown in FIG. 1F, the resist film 20 is removed and the ZnO based semiconductor wafer is washed.

Figure 2A:
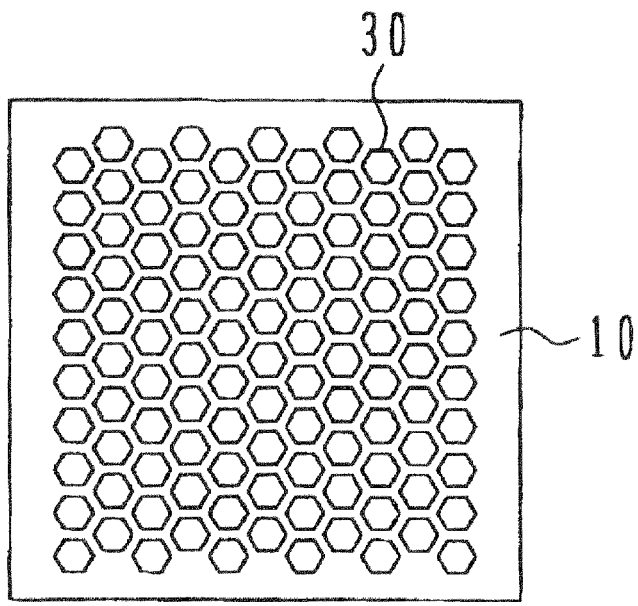
FIGS. 2A and 2B are schematic plan views showing examples of an in-plane shape of irregularity on a −C plane.
Figure 2B:
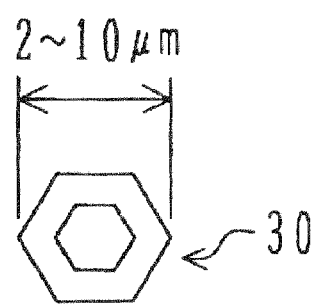
Figure 2C:
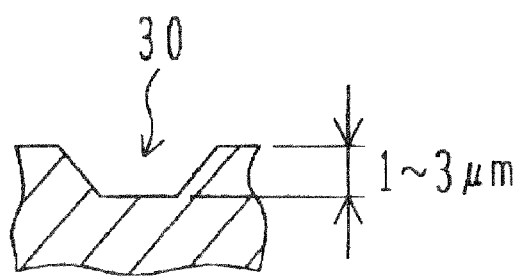
FIGS. 2C and 2D are schematic cross sectional views showing examples of a cross sectional shape of irregularity on the −C plane.

FIG. 2A is a schematic plan view of the −C plane of the ZnO substrate 1 formed with the concavity portions 30. A number of regular hexagonal concavity portions 30 are disposed in the in-plane. As shown in FIG. 2B, a size of one concave portion is, for example, the longest diagonal line length of 2 μm to 10 μm. As shown in the schematic cross sectional view of FIG. 2C, a depth of the concavity portion is, for example, 1 μm to 3 μm.

As described above, a density of etching liquid may be about several % to several ten %. The etching liquid may be other acid etching liquids such as hydrochloric acid aqueous solution and sulfuric acid aqueous solution. The density and temperature of etching liquid are determined by considering an etching depth, an etched surface roughness and a shape precision.

The uppermost surface 12 exposing the LED operation layer 6 is the +C plane so that this plane will not be etched by the etching process for forming concavity/convexity portions on the −C plane of the ZnO substrate 1. Therefore, it is not necessary to protect the surface of the LED operation layer 6 with resist, wax or the like during the etching process for forming the concavity/convexity portions on the −C plane of the ZnO substrate 1.

Figure 3A:
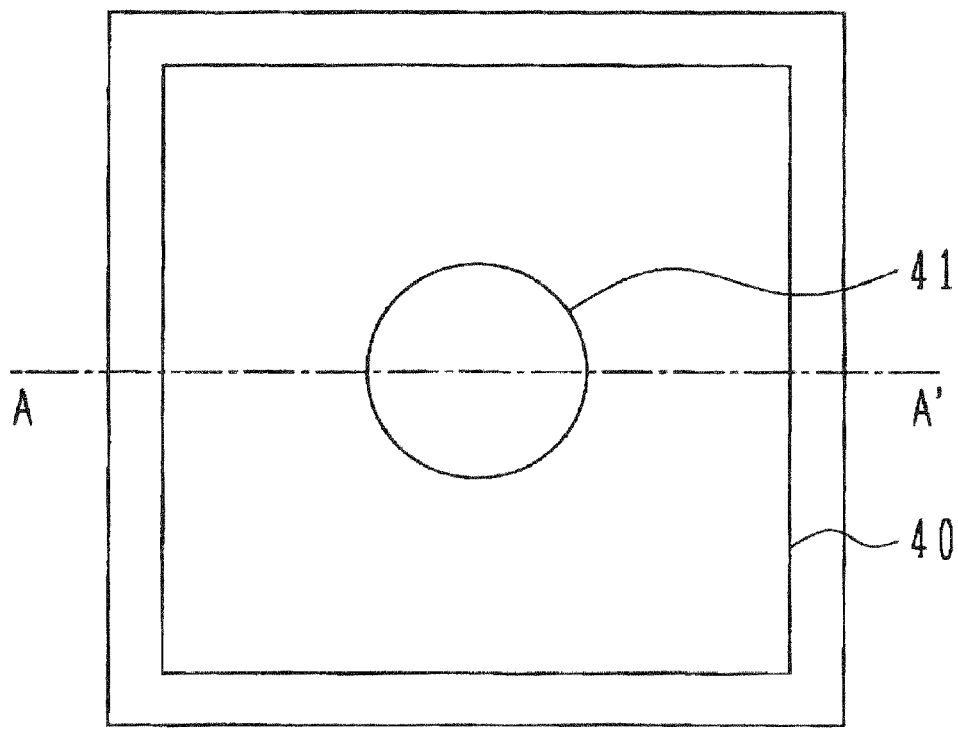
FIG. 3A is a schematic plan view of the light emitting device of the first embodiment.
Figure 3B:
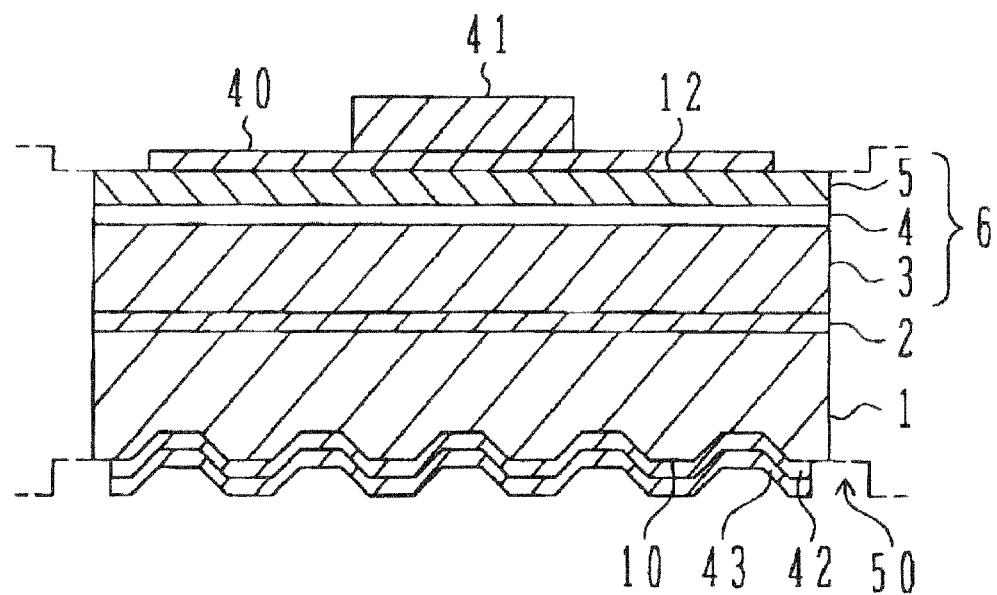
FIG. 3B is a schematic cross sectional view of the light emitting device of the first embodiment.

In succession, with reference to FIGS. 3A and 3B, description will be made on the manufacture process for the ZnO based semiconductor light emitting device. FIG. 3A is a schematic plan view of the light emitting device of the first embodiment, and FIG. 3B is a schematic cross sectional view of the light emitting device of the first embodiment taken along a one-dot chain line AA' in FIG. 3A. In the light emitting device of the first embodiment, light is picked up from the +C plane 12 of the ZnO based semiconductor wafer upwards relative to the light emitting device.

A number of light emitting device structures are formed on one semiconductor wafer at the same time. After a number of light emitting device structures are formed, each light emitting device is separated. In the following, the manufacture process will be described by using one light emitting device as a representative device.

First, a resist mask having an opening shape of a p-side electrode 40 is formed by photolithography on the +C plane 12 which is the upper surface of a p-type ZnO based semiconductor layer 5. An Ni/Au layer is laminated at a thickness of 1 nm/10 nm by electron beam (EB) deposition, thereafter the deposited material other than that in the mask opening area is removed by a lift-off method to form a p-side electrode 40. It is to be noted that if a lamination structure is represented by X/Y, X described at the left side is laminated as a lower layer and Y described at the right side is laminated as an upper layer.

A plan shape of each light emitting device is a square having a side length of, e.g., 350 μm. For example, the p-side electrode 40 is formed as having a size retracted by 5 μm to 10 μm from an edge of each device.

Next, a resist mask having an opening having a shape of an n-side electrode 42 and an n-side electrode connection member 43 is formed on the −C plane 10 of the substrate 1 formed with concavity/convexity portions, by photolithography. A Ti/Ag layer as the n-side electrode 42 is laminated at a thickness of 1 nm to 3 nm/100 nm by EB deposition, then Pt/Au/Pt/Au as the n-side electrode connection member 43 is laminated at a thickness of 100 nm/200 nm/100 nm/200 nm, and thereafter the deposited material other than that in the mask opening area is removed by a lift-off method to form at the same time the n-side electrode 42 and n-side electrode connection member 43.

The n-side electrode 42 is formed by reflecting the concavity/convexity portions on the −C plane and constitutes a scattering/reflecting plane for light incident from the substrate 1 side. The n-side electrode 42 may be a lamination structure of Ti/Al, Pt/Ag, Pt/Al or the like.

Next, electrode annealing is performed in a rapid thermal anneal (RTA) furnace at 450° C. for 30 seconds. 20% oxygen containing nitrogen gas or 100% oxygen gas is used as atmosphere gas. With this process, Ni in the Ni/Au layer is oxidized to form nickel oxide, and the p-side electrode 40 becomes a translucent electrode.

The n-side electrode connection member 43 may be a lamination structure of Ti/Au/Pt/Au—Sn/Au or Pt/Au/Pt/Au—Sn/Au deposited at a thickness of 100 nm/100 nm/100 nm/1000 nm–3000 nm/10 nm so as to make the member be capable of eutectic bonding to a frame. However, if the n-side electrode connection member 43 is made of material capable of eutectic bonding, the above-described annealing is performed to make the p-side electrode 40 translucent, before the n-side electrode 42 and n-side electrode connection member 43 are formed. Further, annealing the n-side electrode is performed separately, for example, at 250° C. for 3 minutes.

Next, a resist mask having an opening having a shape of a p-side electrode pad 41 is formed on a partial surface of the p-side electrode 40 by photolithography. An Ni/Au layer is laminated at a thickness of 100 nm/1000 nm by EB deposition, and thereafter the deposited material other than in the mask opening area is removed to form the p-side electrode pad 41. The p-side electrode pad 41 may be a lamination structure of Ni/Au, Ti/Au, Ni/Rh/Au or Ti/Rh/Au. Metal of the first layer may be Al, Sn, Pb or the like.

Next, a space 50 between the n-side electrode connection members 43 of adjacent devices on the −C plane 10 of the ZnO substrate 1 is scribed to form a scribe groove, and each light emitting device is separated by a breaking apparatus.

In the light emitting device of the first embodiment, light radiated from the emission layer 4 toward the substrate 1 direction is scattered/reflected by the n-side electrode 42 having a shape reflecting the concavity/convexity portions on the –C plane 10 of the substrate 1. Therefore, total reflection at the upper surface 12 of the ZnO based semiconductor wafer is suppressed, and a light pickup efficiency of the light emitting device can be improved As a result, heat generation to be caused by by absorption of emission from the light emitting device by the device itself is suppressed and reliability of the device can be improved.

The LED operation layer 6 is formed above the +C plane of the conductive C plane ZnO substrate 1, and the electrode constituting the scattering/reflecting surface is formed on the –C plane. Since the –C plane can be etched selectively with acid etchant, concavity/convexity portions can be formed only on the –C plan even if the ZnO based semiconductor wafer formed with the LED operation layer 6 is etched without protecting the +C plane.

Figure 2D:

Although the concavity portions are formed on the –C plane, forming the concavity/convexity portions on the –C plane is not limited only thereto. For example, negative/positive of resist may be reversed and convexity portions are formed as shown in FIG. 2D to form concavity/convexity portions. In forming the convexity portions, the in-plane size is also set, for example, to 2 μm to 10 μm and a height is set, for example, to 1 μm to 3 μm.

Figure 4A:
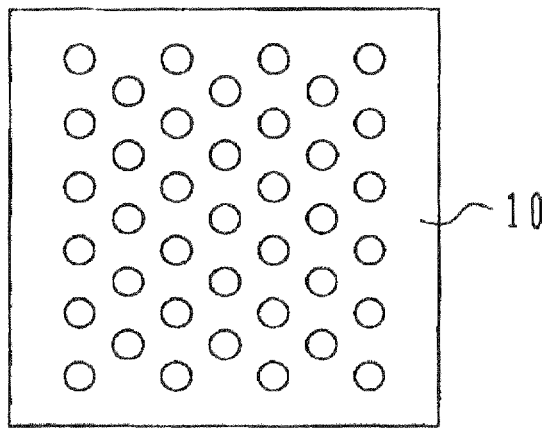
FIGS. 4A and 4B are schematic plan views showing other examples of an in-plane shape of irregularity on the −C plane.
Figure 4B:
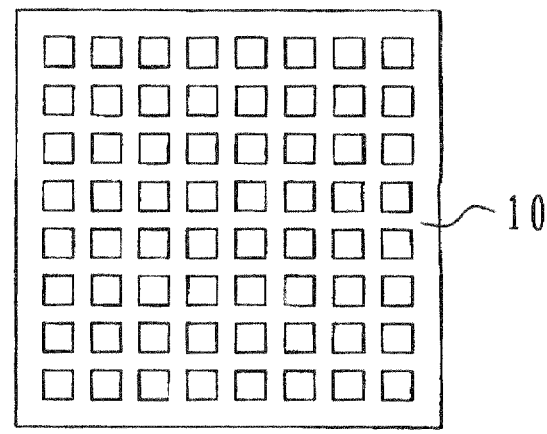

Each concavity portion (or convexity portion) on the –C plane 10 is not limited to a hexagonal shape. For example, as shown in FIG. 4A, a circular concavity portion (or convexity portion) may be used, or as shown in FIG. 4B, a square concavity portion (or convexity portion) may be used. If the scattering/reflecting electrode is formed on the –C plane like the first embodiment, a light pickup efficiency was good if the concavity/convexity portions are formed by forming hexagonal concavity portions.

A device separation by scribing and breaking is easy if a thickness of the substrate is up to about 200 μm so that grinding and polishing are not necessary. If the substrate is thicker than about 200 μm, it is preferable to thin the substrate to about 100 μm to 200 μm.

Figure 5:
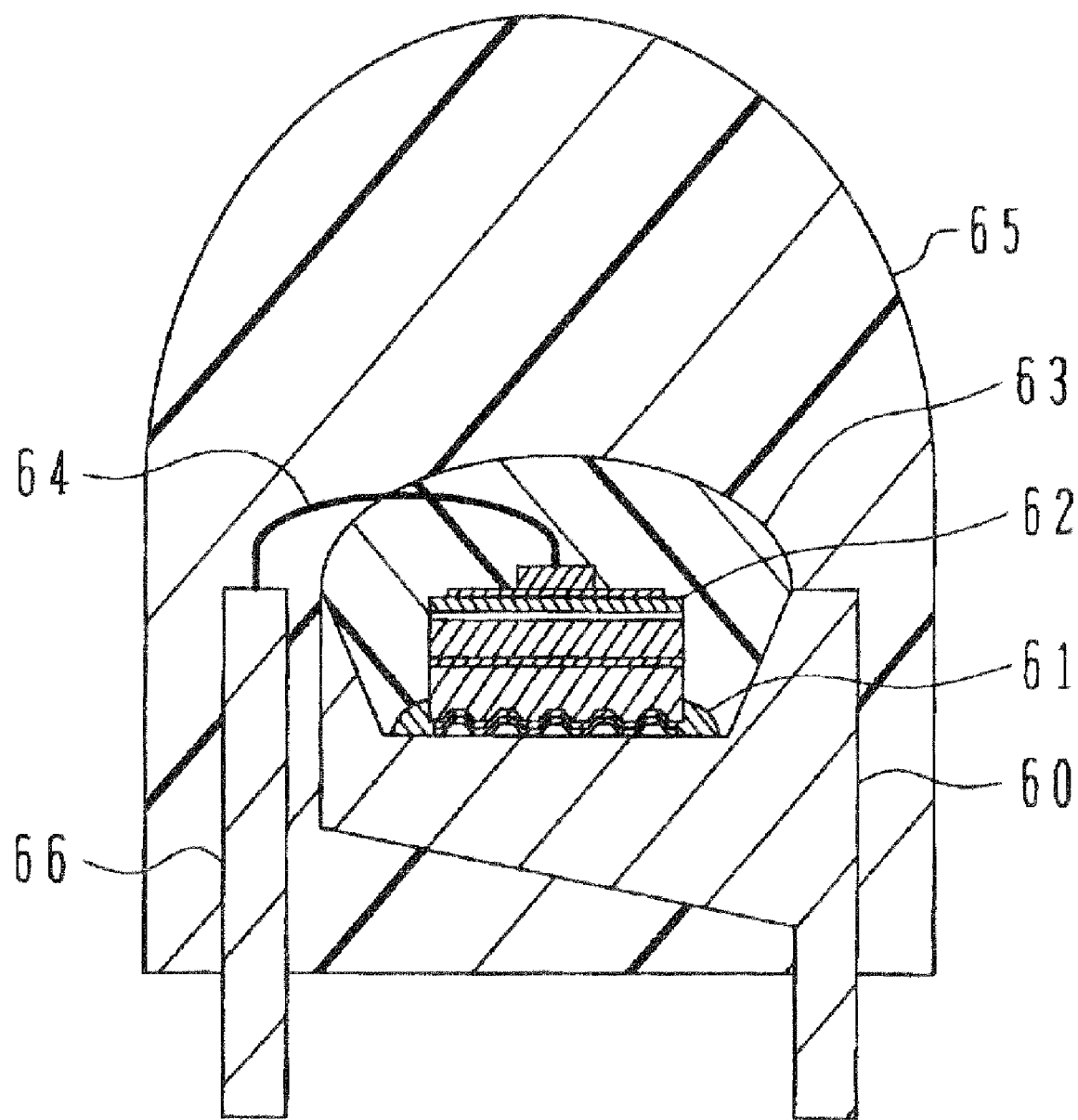
FIG. 5 is a schematic cross sectional view of an LED lamp according to the first embodiment.

Next, description will be made on a manufacture process for an LED lamp using the ZnO based semiconductor light emitting device formed in the manner described above. FIG. 5 is a schematic cross sectional view of an LED lamp according to the first embodiment.

Each separated light emitting device 62 is die-bonded by adhering the n-side electrode connection member to a horn of a frame 60, for example, by silver paste 61, and thereafter, the p-side electrode pad is wire-bonded to a pin 66 by a gold wire 64. Fluorescence dispersed resin 63 is potted covering the light emitting device 62. Lastly, resin mold 65 is formed to complete an LED lamp. Although a bomb shell type lamp has been described, lamps of various types can be manufactured, including a can package, a chip LED, a surface mount package and the like.

Light (e.g., wavelength of 450 nm) emitted from the light emitting device 62 becomes incident upon the fluorescence dispersed resin 63, transmits through the resin mold 65 and is radiated to an outside of the lamp. At least a portion of light emitted from the light emitting device 62 is subjected to wavelength conversion in fluorescence of the fluorescence dispersed resin 63 so that light of mixture color (e.g., white color) is radiated from the LED lamp. A refractive index of the light emitting device 62 is about 2.0, and that of the resin binder of the fluorescence dispersed resin 63 is, for example, about 1.5.

Figure 6A:
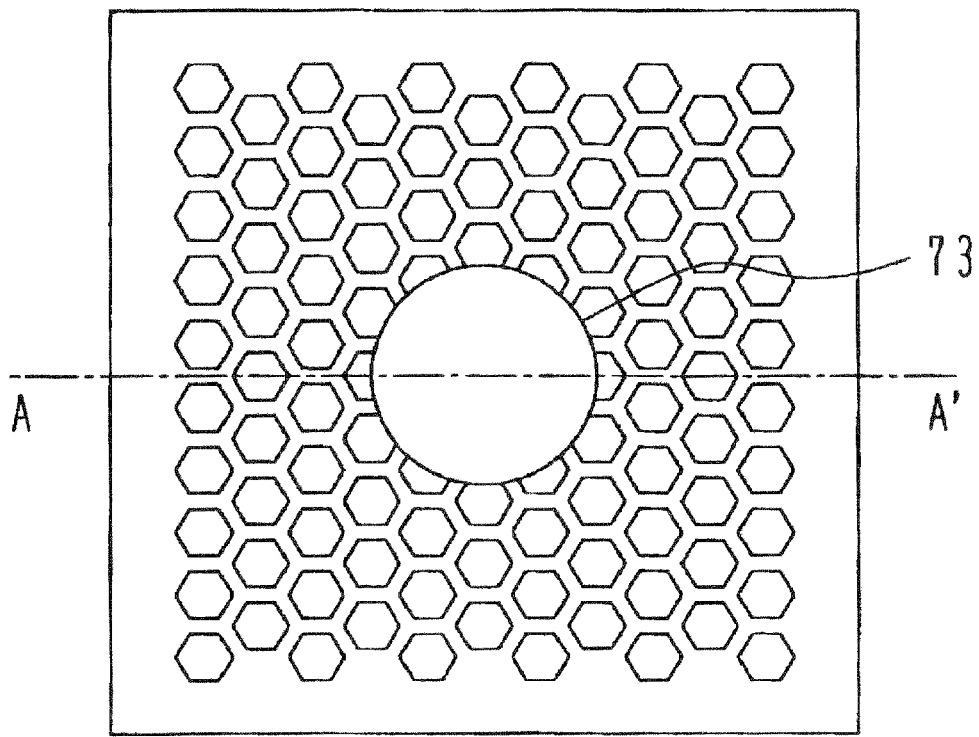
FIG. 6A is a schematic plan view of a light emitting device according to a second embodiment.
Figure 6B:
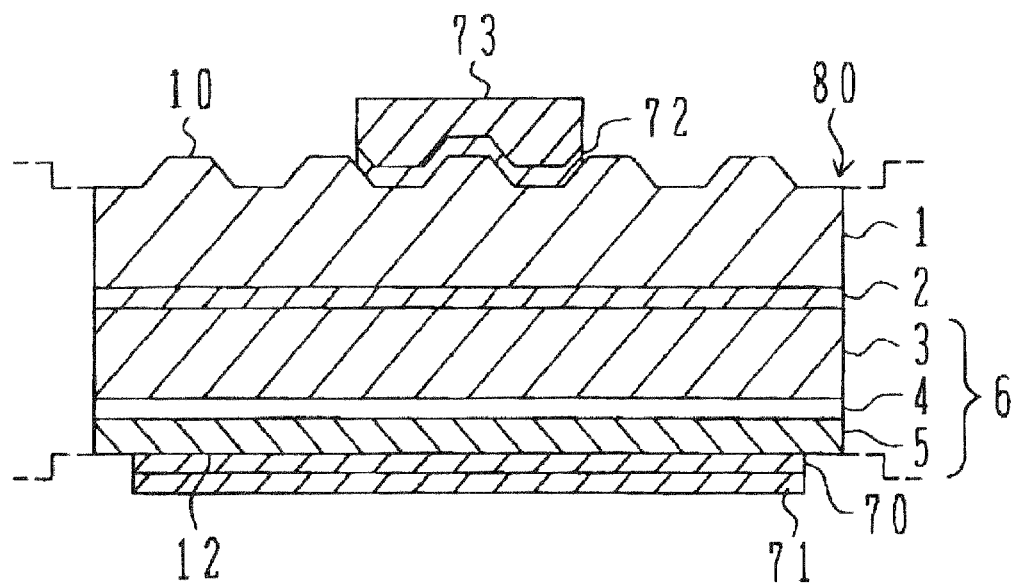
FIG. 6B is a schematic cross sectional view of the light emitting device of the second embodiment

Next, description will be made of a ZnO based semiconductor light emitting device according to the second embodiment. FIG. 6A is a schematic plan view of the light emitting device of the second embodiment, and FIG. 6B is a schematic cross sectional view of the light emitting device of the second embodiment taken along one-dot chain line AA' of FIG. 6A.

In the light emitting device of the second embodiment, light is picked up from the –C plane 10 side of a ZnO based wafer upwards the light emitting device, opposite to the first embodiment. First, similar to the first embodiment, concavity/convexity portions are formed on the –C plane 10 of the ZnO based semiconductor wafer through wet etching with acid etchant. However, in the second embodiment, a concavity/convexity surface is formed by leaving hexagonal convexity portions.

As described in connection with the first embodiment, the concavity/convexity surface can be formed by forming either concavity portions or convexity portions. A shape of each concavity portion (or convexity portion) may be a circle, a square or the like in addition to the hexagon, depending upon necessity Next, a resist mask having an opening shape of a p-side electrode 70 and a p-side electrode connection member 71 is formed by photolithography on the +C plane 12 which is the surface of a p-type ZnO based semiconductor layer 5. An Ni/Ag layer as the p-side electrode 70 is laminated at a thickness of 1 nm to 3 nm/100 nm by electron beam (EB) deposition, then a Pt/Au/Pt/Au layer is laminated at a thickness of 100 nm/200 nm/100 nm/200 nm, and thereafter the deposited material other than that in the mask opening area is removed by a lift-off method to form the p-side electrode 70 and p-side electrode connection member 71 at the same time.

For example, the p-side electrode 70 and p-side electrode connection member 71 are formed as having a size retracted by 5 μm to 10 μm from an edge of each device. A plan shape of each light emitting device is, for example, a square having a side length of 350 μm. The p-side electrode 70 reflects light entered from the substrate 1 side. The p-side electrode 70 may be a lamination structure of Ni/Pt, Ni/Rh, Ni/Al or the like in addition to Ni/Ag.

Next, a resist mask having an opening having a shape of an n-side electrode 72 and an n-side electrode pad 73 is formed on the –C plane 10 of the substrate 1 formed with concavity/convexity portions, by photolithography. A Ti/Ag layer as the n-side electrode 72 is laminated at a thickness of 1 nm to 3 nm/100 nm by EB deposition, in succession, a Pt/Au/Pt/Au layer as the n-side electrode pad 73 is laminated at a thickness of 100 nm/200 nm/100 nm/1000 nm, and thereafter the deposited material other than that in the mask opening is removed by a lift-off method to form the n-side electrode 72 and n-side electrode pad 73 at the same time. The n-side electrode 72 and n-side electrode pad 73 are formed on a partial area of the –C plane 10, and a broad area of the –C plane 10 is exposed. The n-side electrode 72 may be a lamination structure of Ti/Al, Pt/Ag, Pt/Al or the like.

In the first embodiment, the light pickup side is set on the side of the p-side ZnO based semiconductor layer 5 Since the p-side ZnO based semiconductor layer 5 is thin, the p-side transparent electrode was formed broadly covering the surface of the p-side ZnO based semiconductor layer 5 to make current flow properly in the broad area of the operation layer 6 along the thickness direction.

On the other hand, in the second embodiment, the light pickup side is set on the side of the n conductivity type substrate 1. Since the substrate 1 is very thick as compared to the p-side ZnO based semiconductor layer 5, even if the n-side electrode is formed in a relatively narrow area of the substrate 1, current can be flowed properly in the broad area of the operation layer 6 along the thickness direction. Since the transparent electrode broadly covering the light pickup side is not necessary, it is expected to reduce optical absorption by the transparent electrode.

Next, electrode annealing is performed in a rapid thermal anneal (RTA) furnace at 400° C. for 30 seconds. For example, nitrogen gas is used as atmosphere gas.

The p-side electrode connection member 71 may be a lamination structure of Ti/Au/Pt/Au—Sn/Au or Pt/Au/Pt/Au—Sn/Au deposited at a thickness of 100 nm/100 nm/100 nm/1000 nm-3000 nm/10 nm so as to make the member be capable of eutectic bonding to a frame. However, if the p-side electrode connection member 71 is made of material capable of eutectic bonding, a process of forming the n-side electrode 72 and n-side electrode pad 73 and the above-described annealing (400° C. for 30 seconds, nitrogen gas as the atmosphere gas) are performed before the p-side electrode connection member 71 are formed. Further, annealing the p-side electrode is performed separately, for example, at 25° C. for 3 minutes.

Next, a boundary area 80 between adjacent devices on the −C plane of the ZnO substrate 1 is scribed to form a scribe groove, and each light emitting device is separated by a breaking apparatus.

In the light emitting device of the second embodiment, light radiated from the emission layer 4 is output upwards via the −C plane 10 of the substrate 1 formed with the concavity/convexity portions. Total reflection at the ZnO based semiconductor wafer upper surface 10 can be suppressed, and a light pickup efficiency of the light emitting device can be improved. Further, similar to the first embodiment, the concavity/convexity portions can be formed only on the −C plane even if the ZnO based semiconductor wafer formed with the LED operation layer 6 is etched without protecting particularly the +C plane side.

Figure 7:
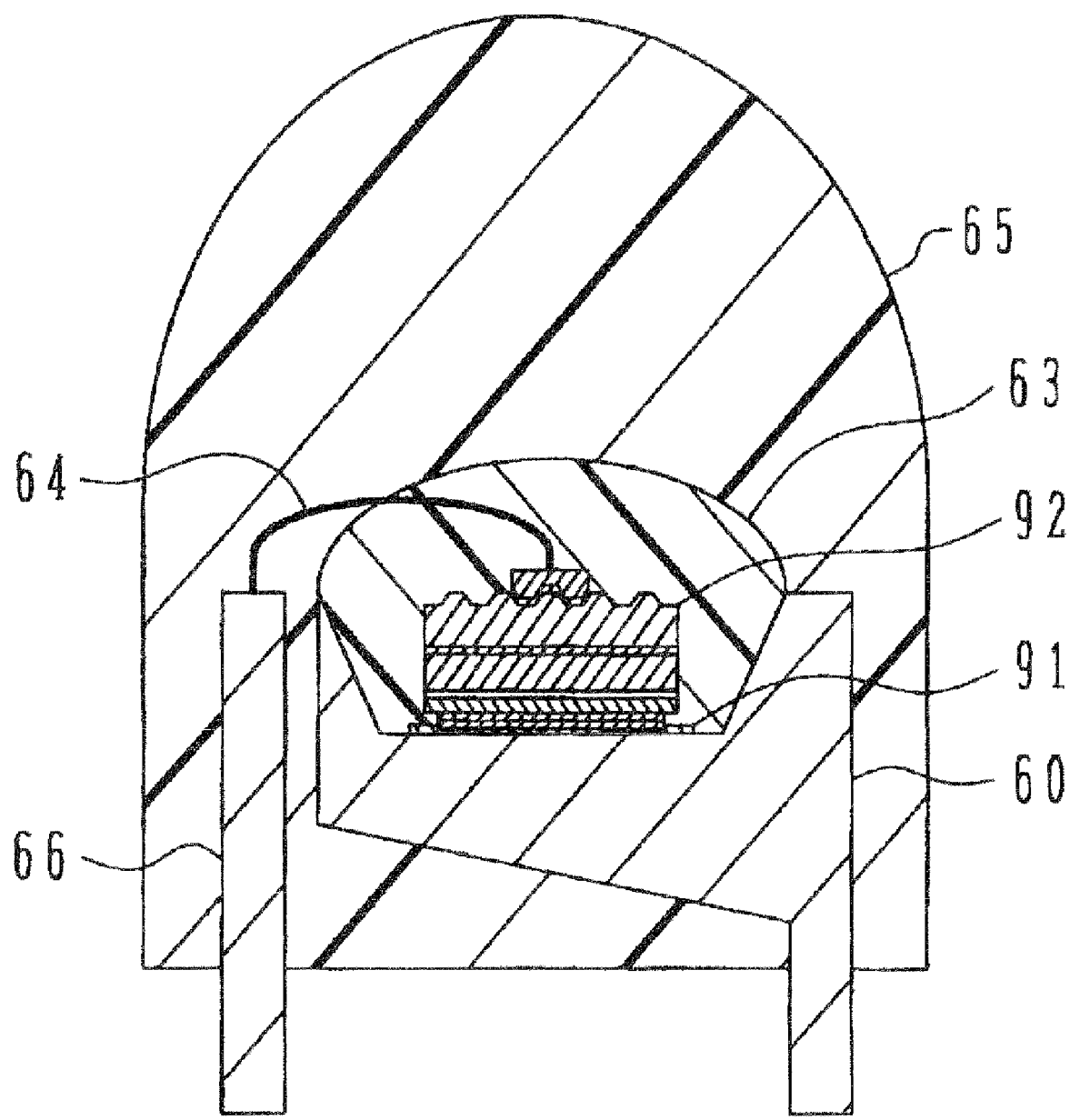
FIG. 7 is a schematic cross sectional view of an LED lamp according to the second embodiment

Next, description will be made on a manufacture process for an LED lamp using the ZnO based semiconductor light emitting device of the second embodiment. FIG. 7 is a schematic cross sectional view of an LED lamp of the second embodiment.

In this example of the LED lamp, eutectic bonding series material is used as the material of the p-side electrode connection member of a light emitting device 92. The p-side electrode connection member of the light emitting device 92 is bonded to a frame 60 via a frame side electrode connection member 91 by Au—Sn eutectic bonding If not the substrate side but the LED operation layer side is to be adhered to the frame (if flip-chip bonding is to be performed), eutectic bonding is preferable because there is a fear of short circuit between p layer and n layer if adhesion is performed using Ag paste or the like.

Thereafter, the n-side electrode pad is wire-bonded to a pin 66 by a gold wire 64, and similar to the first embodiment, fluorescence dispersed resin 63 is potted to form a resin mold 65 and complete an LED lamp. Since the concavity/convexity structure improves tight adhesion between resin and the light emitting device, separation can be suppressed. As a result, it is possible to advantageously suppress a light amount reduction to be caused by a space formed through separation between resin and the light emitting device.

Figure 12A:
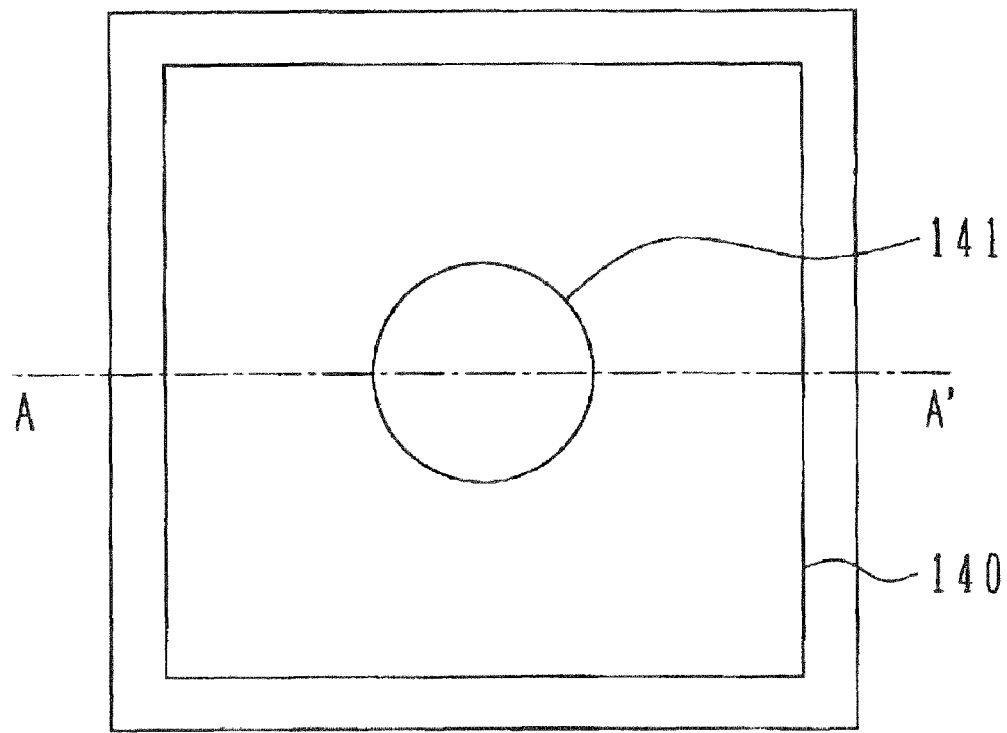
FIG. 12A is a schematic plan view of a light emitting device of a comparative example.
Figure 12B:
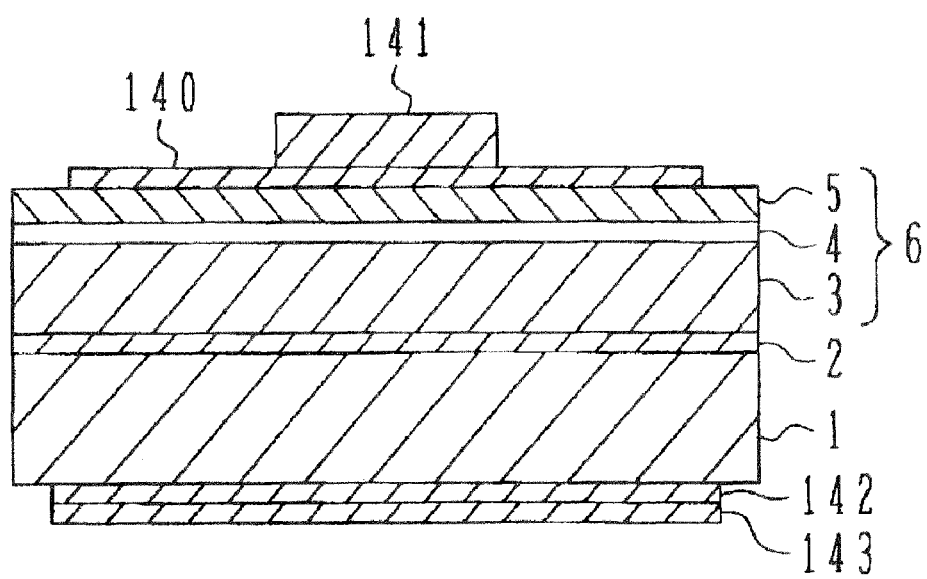
FIG. 12B is a schematic cross sectional view of the light emitting device of the comparative example.

Next, description will be made on a ZnO based semiconductor light emitting device according to a comparative example. FIG. 12A is a schematic plan view of the light emitting device of the comparative example, and FIG. 12B is a schematic cross sectional view of the light emitting device of the comparative example taken along one-dot chain line AA' of FIG. 12A.

Similar to the light emitting device of the first embodiment, in the light emitting device of the comparative example, a translucent p-side electrode 140 is formed on a p-type ZnO based semiconductor layer 5 of a ZnO based semiconductor wafer, and light is picked up upwards the light emitting device via the p-side electrode 140. However, concavity/convexity portions are not formed on the −C plane of the substrate 1.

NiO$_2$—Au is used as the material of the p-side electrode 140. Au is used as the material of a p-side electrode pad 141. Ti is used as the material of an n-side electrode 142, and Au is used as the material of an n-side electrode connection member 143.

Figure 13:
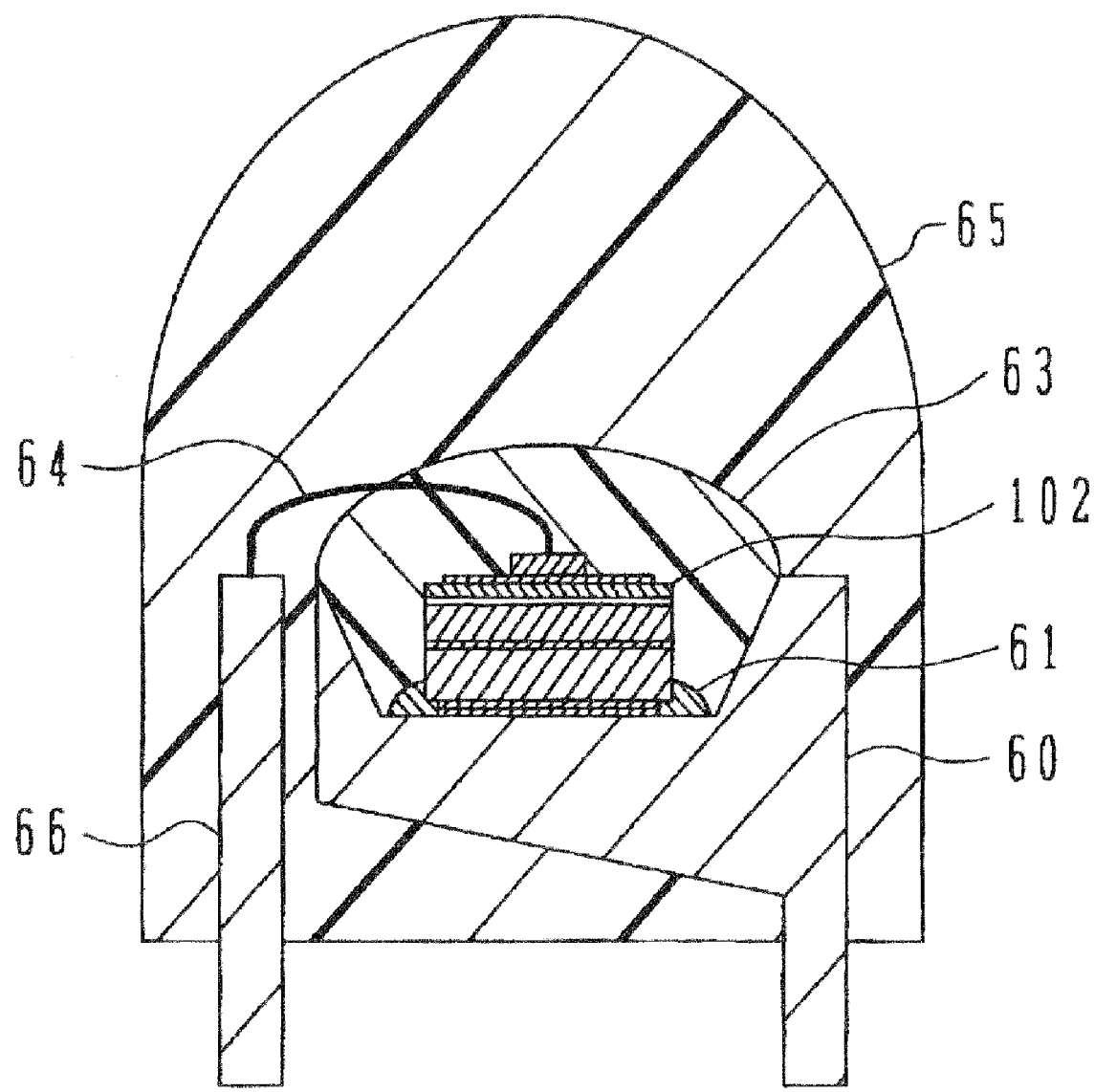
FIG. 13 is a schematic cross sectional view of an LED lamp of a comparative example.

FIG. 13 is a schematic cross sectional view of an LED lamp using the light emitting device of the comparative example. Similar to the LED lamp of the first embodiment, an n-side electrode connection member of a light emitting device 102 is bonded to a frame 60 with silver paste 61, and a p-side electrode pad is wire-bonded to a pin 66 with a gold wire 64. Fluorescence dispersed resin 63 covers the light emitting device 102, and a resin mold 65 is formed.

Next, description will be made on the comparison results of device properties among the light emitting devices of the first and second embodiment and the light emitting device of the comparative example. FIG. 8 is a table showing a list of the comparison results. White LED lamps using fluorescence were formed and total fluxes were measured. Measured values were normalized by setting an output of the comparative example to 100%.

An emission wavelength was 450 nm for all light emitting devices of the comparative example without concavity/convexity portions and the first and second embodiments with concavity/convexity portions. A total flux was 120% for the first embodiment, and 140% for the second embodiment, at 100% for the comparative example.

By forming the concavity/convexity portions on a ZnO based semiconductor wafer substrate, an output was improved. A higher output of the second embodiment than that of the first embodiment may be ascribed to that since the transparent electrode is not formed on the upper surface of the light emitting device of the second embodiment, the influence of optical absorption by the transparent electrode is reduced.

As described above, it is preferable that a thickness of a ZnO based semiconductor wafer substrate is about 200 µm or thinner in order to facilitate device separation. In the first and second embodiments, the concavity/convexity structure was formed by partially etching the −C plane by using a mask to improve a light pickup efficiency. Selective etching of the −C plane may also be utilized for thinning a substrate.

Etching for thinning a substrate will be described by using again FIG. 11. The whole surface of the −C plane 10 is immersed in etching liquid without using a mask so that the substrate 1 can be etched and thinned from the −C plane 10 side.

An example of such etching will be described. A ZnO based semiconductor wafer of 300 µm in thickness with an operation layer was prepared. This ZnO based semiconductor wafer was set in a solution circulating type etching vessel, and processing was performed at a room temperature for 15 hours by using 10% nitric acid aqueous solution as etching liquid.

With this processing, the whole surface of the −C plane was etched, and a thickness of the ZnO substrate was thinned to 150 µm. It is expected to shorten an etching process time by optimizing the conditions such as a nitric acid density, a process temperature and a circulating flow speed.

If a ZnO substrate is too thick, a desired thickness can be obtained by such etching. Since only the −C plane can be etched, even if the operation layer is already formed on the +C plane, an etching process can be performed simply without particularly protecting the operation layer surface. The ZnO based semiconductor wafer thinned to a desired thickness can be used for manufacturing, for example, the light emitting devices of the first and second embodiments (or comparative example).

In a conventional grinding/polishing process for thinning a substrate, a wafer is attached to a holding base with wax, adhesive tape or the like, grinded with a grind stone, and polished with diamond slurry or the like. Further, after this work, there are works such as dismounting the thinned wafer from the holding base, and a wafer is likely to be broken during these works. Since a wafer can be thinned by wet etching, it is expected that a process yield can be improved and the number of processes and the installation cost and the like can be reduced.

As described so far, when a ZnO crystal plate having one surface being a −C plane and the other surface being a +C plane is subjected to wet etching by acid etchant, the −C plane can be selectively etched.

For example, even if the entirety of a wafer having an ZnO based semiconductor operation layer already grown above the +C plane of a C plane ZnO substrate is etched without forming a protective layer for protecting the +C plane from the etching liquid, only the −C plane can be etched while suppressing damages of the operation layer.

It is preferable that the operation layer is formed on the +C plane of a ZnO substrate by ensuring the surface of the +C plane. The reason for this is that if bicrystal such as polarity inversion or a domain (grain boundary) oriented in another crystal axis direction (e.g., a-axis, m-axis directions) exists in the operation layer, the operation layer is etched in this area.

However, a −C orientation domain may be mixed slightly in an operation layer grown with +C orientation. If a substrate with an operation layer grown with +C orientation and slightly mixed with a −C orientation domain is etched by a dry process or the like, the −C orientation domain is left in a finished light emitting device.

In this case, defects of this light emitting device cannot be detected unless a random check in a electrostatic breakdown voltage test, a lifetime test or other tests selects a light emitting device containing a −C orientation domain. Namely, a general I-V test performing a total inspection cannot recognize defects.

However, by using the above-described wet etching, a −C orientation domain can be eliminated during etching. Therefore, a translucent electrode and a substrate contact each other in the eliminated region, for the device structure of the first embodiment. For the device structure of the second embodiment, a p-type electrode and a substrate contact each other. It is therefore possible that an I-V test after completion of a light emitting device can easily recognize defects. Namely, this etching method contribute to yield improvement of ZnO based semiconductor devices.

A crystalline plane of a substrate and operation layer may have an inclination of several degrees along an m- or a-axis direction and is not necessary to be perfectly coincident with the C plane.

The present invention has been described in connection with the preferred embodiments. The present invention is not limited to the embodiments, but it is obvious for those skilled in the art that various alterations, modifications, combinations and the like are possible.

What we claim are:

1. A manufacturing method for a ZnO based semiconductor device, the method comprising:
   preparing a ZnO based semiconductor wafer including a ZnO based semiconductor substrate having a wurzeit structure with a +C plane on one surface and a −C plane on an opposite surface, a first ZnO based semiconductor layer having a first conductivity type epitaxially grown above the +C plane of said ZnO based semiconductor substrate, and a second ZnO based semiconductor layer having a second conductivity type opposite to said first conductivity type epitaxially grown above said first semiconductor layer; and
   wet-etching said ZnO based semiconductor wafer with acid etching liquid to etch the −C plane of said ZnO based semiconductor substrate, with a +C plane of said ZnO based semiconductor wafer exposed to said acid etching liquid.

2. The method according to claim 1, wherein said wet-etching forms concavity/convexity portions on the −C plane of said ZnO based semiconductor substrate, which is electrically conductive, and the method further comprises:
   forming a first electrode on the −C plane formed with the concavity/convexity portions by said wet-etching; and
   forming a second electrode above said second semiconductor layer.

3. The method according to claim 2, wherein said first electrode is formed on said −C plane to reflect light incident from a side of said ZnO based semiconductor substrate, and said second electrode is formed above said second semiconductor layer to transmit light incident from a side of said second semiconductor layer.

4. The method according to claim 2, wherein said said first electrode is formed on a partial area of said −C plane, and said second electrode is formed above said second semiconductor layer to reflect light incident from a side of said second semiconductor layer.

5. The method according to claim 4, further comprising:
   bonding said second semiconductor layer to a support electrode member via said second electrode.

6. The method according to claim 1, wherein said wet-etching thins said ZnO based semiconductor substrate by etching a whole surface of the −C plane of said ZnO based semiconductor substrate.

7. The method according to claim 1, wherein said wet-etching uses as said acid etching liquid a material selected from a group consisting of nitric acid aqueous solution, sulfuric acid aqueous solution, hydrochloric acid aqueous solution, phosphoric acid aqueous solution, acetic acid aqueous solution, a mixed aqueous solution of these acids and acid buffer aqueous solution.

* * * * *